(12) United States Patent
Sen et al.

(10) Patent No.: US 11,871,135 B2
(45) Date of Patent: Jan. 9, 2024

(54) CIRCUIT AND METHOD FOR IMAGE ARTIFACT REDUCTION IN HIGH-DENSITY, HIGH-PIXEL-COUNT, IMAGE SENSOR WITH PHASE DETECTION AUTOFOCUS

(71) Applicant: OmniVision Technologies, Inc., Santa Clara, CA (US)

(72) Inventors: Selcuk Sen, Mountain View, CA (US); Liang Zuo, Milpitas, CA (US); Rui Wang, San Jose, CA (US); Xuelian Liu, Sunnyvale, CA (US); Min Qu, Mountain View, CA (US); Hiroaki Ebihara, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 100 days.

(21) Appl. No.: 17/592,389

(22) Filed: Feb. 3, 2022

(65) Prior Publication Data

US 2023/0247330 A1  Aug. 3, 2023

(51) Int. Cl.
| | | |
|---|---|---|
| *H04N 25/779* | (2023.01) | |
| *H01L 27/146* | (2006.01) | |
| *H04N 25/621* | (2023.01) | |
| *H04N 25/76* | (2023.01) | |
| *H04N 25/60* | (2023.01) | |
| *H04N 25/704* | (2023.01) | |
| *H04N 25/42* | (2023.01) | |
| *H04N 25/13* | (2023.01) | |

(52) U.S. Cl.
CPC ..... *H04N 25/779* (2023.01); *H01L 27/14609* (2013.01); *H01L 27/14643* (2013.01); *H04N 25/42* (2023.01); *H04N 25/60* (2023.01); *H04N 25/623* (2023.01); *H04N 25/704* (2023.01); *H04N 25/76* (2023.01); *H04N 25/134* (2023.01)

(58) Field of Classification Search
CPC ...... H04N 25/779; H04N 25/42; H04N 25/60; H04N 25/623; H04N 25/704; H04N 25/76; H04N 25/134; H04N 25/11; H04N 25/40; H04N 25/44; H04N 25/443; H04N 25/445; H04N 25/46; H04N 25/62; H04N 25/628; H04N 25/63; H04N 25/633; H04N 25/67; H04N 25/671; H04N 25/677; H04N 25/70; H04N 25/703; H04N 25/778; H04N 25/7795; H01L 27/14609; H01L 27/14643
See application file for complete search history.

(56) References Cited

U.S. PATENT DOCUMENTS

| | | | | |
|---|---|---|---|---|
| 5,543,838 | A  * | 8/1996 | Hosier | H04N 3/1512 |
| | | | | 348/304 |
| 10,319,774 | B2 * | 6/2019 | Arita | H04N 25/70 |
| 10,623,675 | B2 * | 4/2020 | Lee | H04N 5/04 |

(Continued)

*Primary Examiner* — Albert H Cutler
(74) *Attorney, Agent, or Firm* — COZEN O'CONNOR (57) ABSTRACT

In an embodiment, a method of reducing resistance-capacitance delay along photodiode transfer lines of an image sensor includes forking a plurality of photodiode transfer lines each into a plurality of sublines coupled together and to a first decoder-driver at a first end of each subline; and distributing selection transistors of a plurality of multiple-photodiode cells among the plurality of sublines. In embodiments, the sublines may be recombined at a second end of the sublines and driven by a second decoder-driver at the second end.

14 Claims, 5 Drawing Sheets

(56) References Cited

U.S. PATENT DOCUMENTS

| | | | | |
|---|---|---|---|---|
| 2011/0128425 A1* | 6/2011 | Schemmann | ........ | H04N 3/1562 |
| | | | | 348/300 |
| 2013/0194471 A1* | 8/2013 | Yamashita | ........ | H01L 27/14607 |
| | | | | 348/308 |
| 2017/0230600 A1* | 8/2017 | Tsuboi | .............. | H01L 27/14643 |
| 2019/0383917 A1* | 12/2019 | Shinozuka | ............... | G01C 3/06 |
| 2021/0112216 A1* | 4/2021 | Choi | ...................... | H04N 25/40 |
| 2021/0337144 A1* | 10/2021 | Wang | .................... | H04N 25/75 |

* cited by examiner

CIRCUIT AND METHOD FOR IMAGE ARTIFACT REDUCTION IN HIGH-DENSITY, HIGH-PIXEL-COUNT, IMAGE SENSOR WITH PHASE DETECTION AUTOFOCUS

BACKGROUND

Applicants design high pixel count image sensors for the worldwide market. Some of these sensors have more than 100,000,000 photodiodes. In one such image sensor there are 12,096 photodiodes in each row of photodiodes across the array, causing significant resistance-capacitance (R-C) delay along row select lines of the array. Other high-pixel-count image sensors may have other large counts of photodiodes across the array.

It is desirable to limit R-C delay across the image sensor photodiode array to avoid exposure and read timing differences between columns of the array that can cause noticeable artifacts in images.

SUMMARY

In an embodiment, an array of multiple-photodiode cells each having multiple photodiodes, each photodiode coupled through a selection transistor to a common node of the multiple-photodiode cell, the selection transistors controlled by respective photodiode transfer lines, a reset transistor coupled to the common node of the multiple-photodiode cell, a sense source follower controlled by the common node of the multiple-photodiode cell, and a read transistor coupled from the sense source follower to a data line. The array has at least one phase detection row comprising phase detection multiple-photodiode cells of the multiple-photodiode cells and normal multiple-photodiode cells of multiple-photodiode cells; and at least one compensation row of dummy multiple photodiode cells of the multiple-photodiode cells. Each of the at least one phase detection row has at least one multiple-photodiode cell with at least one photodiode coupled to the common node of the phase detection multiple-photodiode cell by a selection transistor controlled by a photodiode transfer line separate from photodiode transfer lines coupled to selection transistors of normal multiple-photodiode cells of the phase detection row; and the photodiode transfer lines coupled to the selection transistors of the normal multiple-photodiode cells of the phase detection row are configured with a resistance-capacitance delay reduction of either a first decoder coupled to a first end of the photodiode transfer lines coupled to the selection transistors of the normal multiple-photodiode cells and a second decoder coupled to a second end of the photodiode transfer lines coupled to the selection transistors of the normal multiple-photodiode cells, or forking the photodiode transfer lines coupled to the selection transistors of the normal multiple-photodiode cells.

In an embodiment, a method of reducing resistance-capacitance delay along photodiode transfer lines of an image sensor includes forking a plurality of photodiode transfer lines each into a plurality of sublines coupled together and to a first decoder-driver at a first end of each subline; and distributing selection transistors of a plurality of multiple-photodiode cells among the plurality of sublines.

DETAILED DESCRIPTION OF THE EMBODIMENTS

Figure 1:
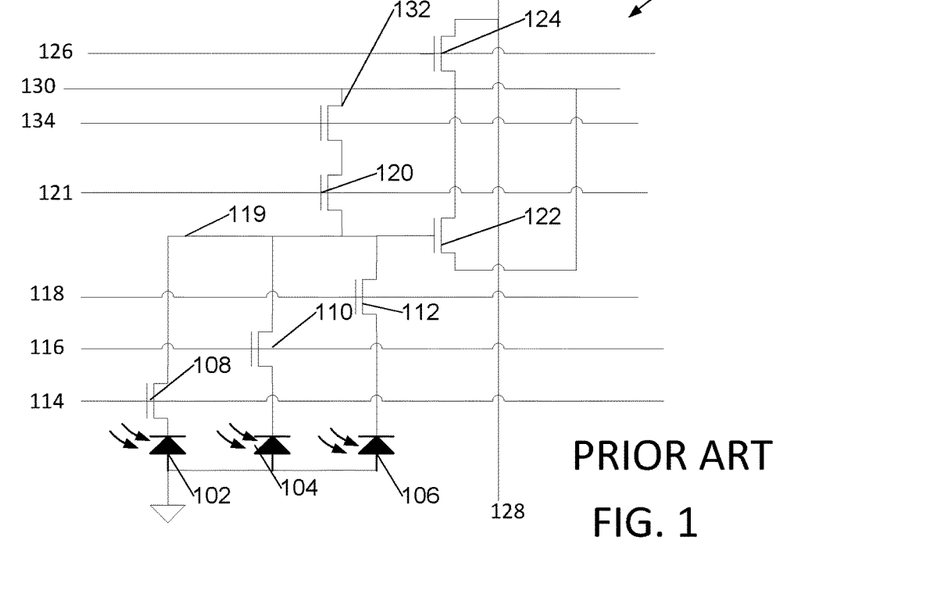
FIG. 1 is a schematic diagram of a group of photodiodes sharing common reset and sense transistors, as known in the art.

Each photodiode 102, 104, 106 of a standard multiple photodiode cell 100 of many large-array image sensors, as illustrated in FIG. 1, has a selection transistor 108, 110, 112 having a gate coupled to a photodiode transfer line 114, 116, 118. Several, in the illustrated schematic three, of these selection transistors 108, 110, 112, drive a common node 119 and share a common reset transistor 120. Alternative embodiments may have different numbers of selection transistors driving the common node. Common node 119 is coupled to a gate of a common sense source-follower transistor 122. Reset transistor 120, controlled by reset line 121, couples common node 119 to an analog power 130 to clear common node 119 before reading each pixel and to precharge each photodiode at the start of each exposure. A source of common sense source-follower transistor 122 is coupled through a sense row select transistor 124 controlled by sense row select line 126 to a data line 128. In some image sensors a source follower transistor 132 controlled by a reference voltage 134 is coupled between analog power 130 and reset transistor 120.

Many of these image sensors are adapted to using the "phase detection autofocus" (PDAF) scheme. In cameras using these image sensors with PDAF, we desire to perform imaging with a reduced number of pixels to conserve power while obtaining phase-detection images until autofocus is achieved, then perform imaging at full device resolution to capture an image in correct focus.

With such large photodiode counts in an image sensor array, differences in loads on data lines 128, or differences in resistance-capacitance (RC) delays along photodiode transfer lines 114, 116, 118, can cause image artifacts. Further, differences in transfer line voltages can also cause image artifacts.

In some large-photodiode-count image sensors, in order to reduce potential leakage in selection transistors 108, 110, 112, row selection lines such as photodiode transfer lines 114, 116 118, are driven between analog power and a negative voltage provided by an on-chip charge pump.

Figure 2:
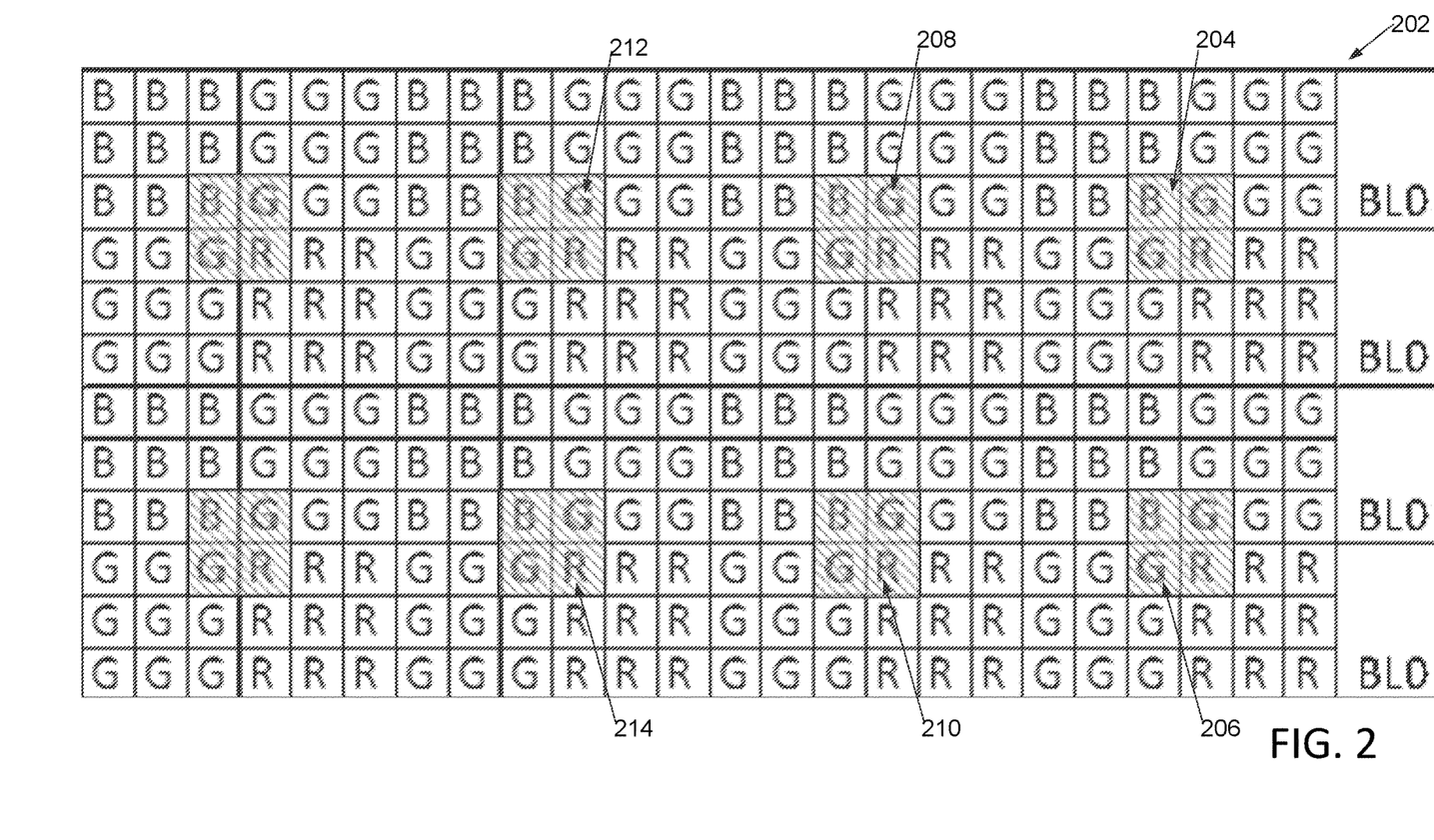
FIG. 2 illustrates color mask colors of a subset of photodiodes of an image sensor array, with highlighted 4-pixel groups of photodiodes that are read into thinned images for autofocus purposes.

In an image sensor array, each photodiode has a color filter as illustrated by R for red, G for green, B for blue in the subset 202 illustrated in FIG. 2. For clarity, only photodiode color filters are shown, with transfer selection, sense, reset, and sense row select transistors omitted from FIGS. 2 and 4, and 6.

As the human eye responds to images with higher intensity resolution than color resolution, as common in electronic cameras since the 1953 introduction of NTSC color television, in particular embodiments of the image sensor higher resolution is provided for an intensity information than for color information. In the embodiment illustrated in FIG. 2, a red-green-green-blue (RGGB) Bayer-pattern is used and organized as a square pattern of four square groups, or quadrants, of photodiodes, with nine photodiodes in each square group or quadrant of photodiodes; each square group being organized as a rectangular block. In alternative embodiments, a modified Bayer pattern may be used such as an RGWB (W being white) in place of the RGGB pattern illustrated; and in other alternative embodiments the square groups of photodiodes may include 1, 4, 9 (illustrated), 16, or 25 photodiodes each.

In an image sensor adapted for phase detect autofocus using thinned images each obtained using a subset of photodiodes of the array, it is desired to read pixels shown in gray shaded boxes 204, 206, 208, 210, 212, 214, in a subset 202 of the image sensor array, each gray shaded box containing one each of red and blue pixel, and two green pixels. To do so, a subset of photodiodes, including the photodiodes of each gray shaded box, along certain rows are selected using a different set of row lines, as illustrated in FIG. 3.

Figure 3:
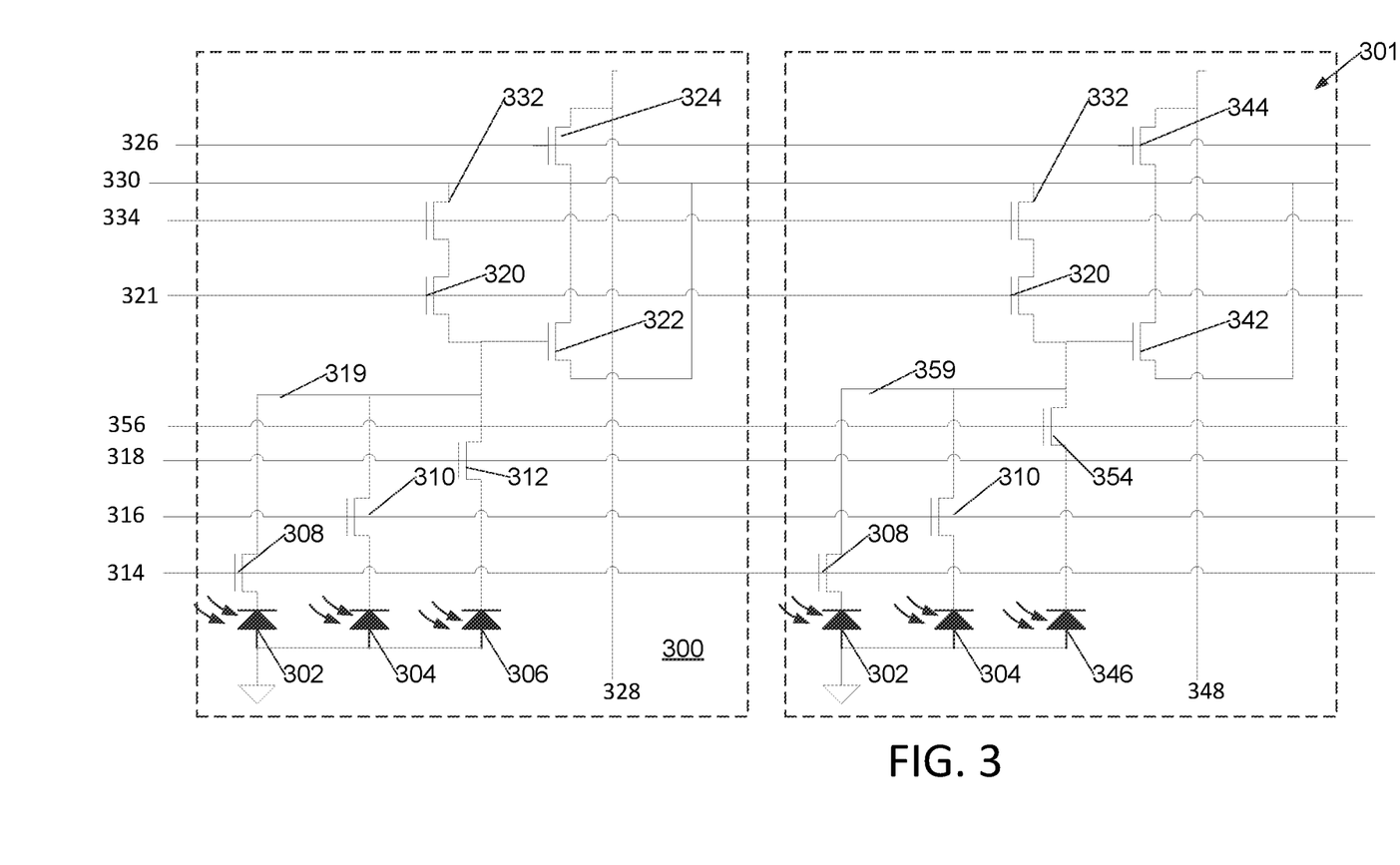
FIG. 3 is a schematic diagram of a pair of multiple-photodiode cells, each with common reset and sense transistors, where one photodiode of each cell is controlled by a separate transfer line for use with phase detection autofocus.

Each photodiode 302, 304, 306 of a normal multiple-photodiode cell 300, in an embodiment tailored for use with phase detection autofocus as illustrated in FIG. 3, has an associated selection transistor 308, 310, 312 having a gate coupled to a photodiode transfer line 314, 316, 318. Several, in the illustrated schematic three of these selection transistors 308, 310, 312, drive a common node 319 and share a common reset transistor 320. Common node 319 is coupled to a gate of a common sense source-follower transistor 322. Reset transistor 320 couples common node 319 to an analog power 330 to clear common node 319 before reading each pixel and to precharge each photodiode at the start of each exposure. A drain of sense source-follower transistor 322 is coupled through a sense row select transistor 324 controlled by sense row select line 326 to a data line 328. In an embodiment, a source follower transistor 332 controlled by a reference voltage 334 is coupled between the reset transistor and analog power 330.

An adjacent, phase detection, cell 301 differs from normal multiple-photodiode cell 300 in that one photodiode 346 is coupled through a selection transistor 354 to common node 359 by a phase detection transfer line 356 different from the normal-cell-only photodiode transfer line 318 of normal multiple-photodiode cell 300. Common node 359 is coupled to a gate of grounded-source common sense source-follower transistor 342, common sense source-follower transistor's source is coupled through row select transistor 344 to data line 348. Other components of phase detection multiple-photodiode cell 301 having same reference numbers as in normal multiple-photodiode cell 300 have function similar to those in normal multiple-photodiode cell 300.

Figure 4:
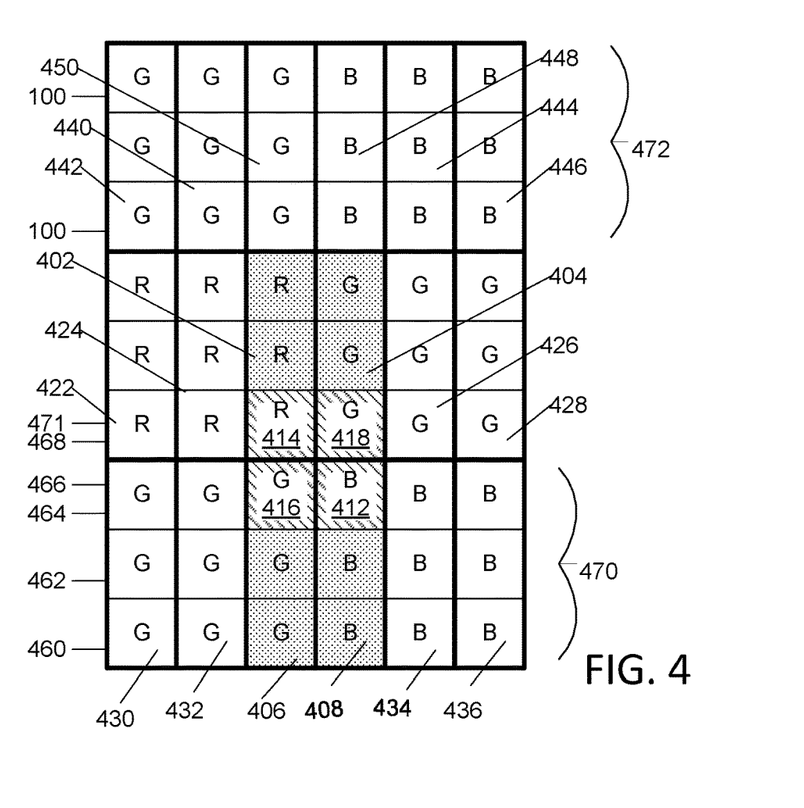
FIG. 4 is a schematic illustration of multiple-photodiode cells of the types illustrated in FIG. 3 are deployed in around each phase detection region.

Applying the normal multiple-photodiode cell 300 and phase-detection multiple photodiode cell 301 (FIG. 3) into a layout according to FIG. 2 gives a photodiode and cell pattern according to FIG. 4, where groups of four phase-detection multiple-photodiode cells 402, 404, 406, 408 are arranged such that the one photodiode 346 controlled by phase detection transfer lines 356 of each phase-detection multiple-photodiode cell 402, 404, 406, 408 is positioned adjacent three other photodiodes 346 controlled by phase detection transfer lines 356 of phase detection multiple-photodiode cells 402, 404, 406, 408 to give a four-photodiode Bayer-pattern of adjacent phase-detection photodiodes 412, 414, 416, 418. In the embodiment illustrated, an R-G-G-B pattern is illustrated, however in other image sensors a modified Bayer-pattern such as an R-G-W-B or a C (cyan)-Y (yellow)-Y-M (magenta) color-filter pattern may be used. Each group of four phase-detection multiple-photodiode cells 301, 402, 404, 406, 408 may be separated by one or more 422, 424, 426, 428, 430, 432, 434, 436 normal multiple-photodiode cells 300 in each phase detection row 470, and rows containing phase-detection multiple-photodiode cells 301 may be separated by standard rows 472 containing only standard multiple-photodiode cells 100, 440, 442, 444, 446, 448, and 450.

The disclosed image sensor permits reading of thinned images for phase-detection autofocus purposes while conserving power by not reading photodiode rows not having phase-detection photodiodes and by not using, and thus not requiring sensing or re-precharging of, data lines 328 not associated with phase-detection photodiodes of phase detection rows 470.

The layout as heretofore described, however, provides three groups of row select or transfer lines with different capacitive loadings because they couple to different counts of selection transistors. These include a first group of fully-loaded transfer lines such as 314, 316, 460, 462 that couple to transfer transistors in normal multiple-photodiode cells 300 and phase-detection multiple-photodiode cells 301, along with photodiode transfer lines 114, 116, 118 of standard multiple-photodiode cells, a second group of intermediate-loaded transfer lines such as photodiode transfer line 318, 464, 468 that couple to transfer transistors in normal multiple-photodiode cells 300, and a third group of lightly-loaded transfer lines such as phase-detection transfer lines 356, 466, 471 that couple to transfer transistors only in phase detection multiple-photodiode cells 301.

It should be noted that, during reading of phase-detection thinned images, only the third group of transfer lines are used, while during reading of normal images all three groups of transfer lines are used. Further, while reading both types of images, only one transfer line is used between each pulse of the reset line to allow individual rows of photodiodes to be read onto the data lines.

The differences in loading on the first, second, and third groups of transfer lines can result in two phenomena:
  a) a faster signal propagation along the third group of transfer lines than along the first group of transfer lines because of reduced resistance-capacitance (R-C) delay, and
  b) because transfer lines of the third group are more lightly loaded, when they switch a smaller change in voltage 602 (FIG. 5) provided by the on-chip charge-pump occurs when the third group of transfer lines are pulsed 604 than a change in voltage 606 when lines of the first 608 or second 610 group are pulsed. Since this change in voltage is coupled through drivers onto negative transfer lines and through parasitic capacitances of selection transistors onto common nodes 359, 319, 119, it can cause a slight disturbance in photodiode readings as they are coupled onto data lines.

The combination of these two effects can cause a visible horizontal artifact in full image captured with the image sensor.

To prevent the visible horizontal artifact, we introduce at least one, and in a particular embodiment 72, compensation rows 504 (FIG. 6) disposed adjacent the active array 502 of the image sensor that incorporates multiple standard rows 505 and PD autofocus rows 503 as heretofore described. Each compensation row has dummy photodiodes with selection transistors equivalent to those of a phase detection row. An intermediate-load transfer line of a compensation row, equivalent to an intermediate-load photodiode transfer line 318 of a phase-detection row, is activated each time a lightly loaded phase-detection transfer line 356 of a phase-detection row is activated. Similarly, a lightly loaded phase-detection transfer line 356 of a compensation row, equivalent to a lightly loaded phase-detection photodiode transfer line 356 of a phase-detection row, is activated each time an intermediate-load normal-cell photodiode transfer line 318 of a phase-detection row is activated. A blank line of a compensation row that couples to no selection transistors is activated each time a regular transfer line of a phase detection row 470 or of a standard row 472 is activated. In this way, capacitive loads coupled onto the charge pump are matched for each activation of a transfer line, thereby producing the voltage change of the first 608 group.

Figure 6:
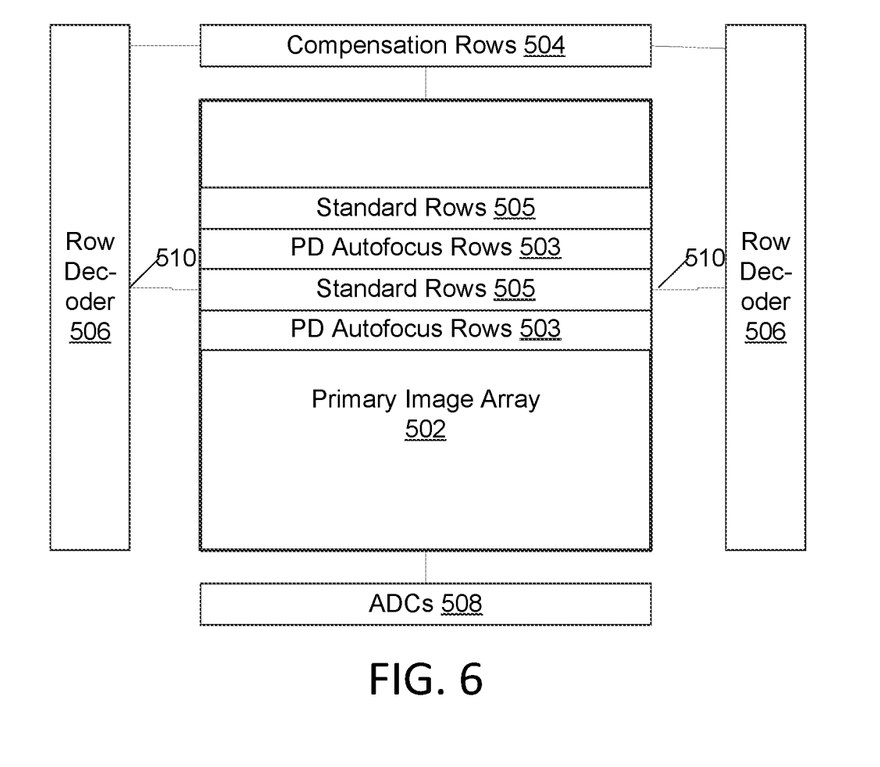
FIG. 6 is a schematic illustration of dummy lines added to the array to balance loads on phase detection transfer lines.

Compensation rows 504 are coupled to data lines 328, 348 of the active array 502 but their row selection lines 321 are never activated.

Figure 5:
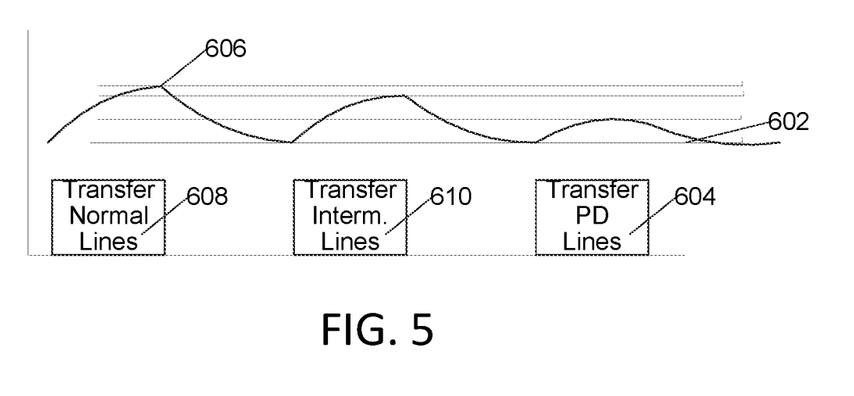
FIG. 5 illustrates voltage changes on the negative charge pump output due to switching transients on transfer lines.

Since using the compensation rows in this way matches disturbances on the negative voltage 602 the on-chip charge-pump produces, visible horizontal artifacts in images captured with the image sensor due to phenomena (b) above are cancelled, leaving cleaner images than those obtained without using compensation rows in similar manner.

In order to match propagation delay and suppress artifacts due to phenomena (a) above, transfer lines of the first, second, and third group are laid out as below described with reference to FIGS. 6, 7, and 8.

Further, we note that in some embodiments, twelve thousand or more selection transistors may need driving by each transfer line. Each selection transistor has significant gate-to-body, gate-to-source, and gate-to-drain capacitance therefore total capacitance on transfer lines is significant and, because the lines are both long and quite narrow, these lines have significant resistance despite being formed of low-sheet-resistance metal.

We also note that the RC-delay reduction technique of breaking long lines halfway to insert buffer amplifiers works well in logic circuits and memories but could cause image artifacts if used in image sensors.

We note that design rules and detailed layout of multiple-photodiode cells 100, 300, 301 prohibit using row select or transfer lines that are significantly wider than minimum-dimension metal lines of the same integrated circuit layer. Such design rules are often used because photolithography and etching techniques required for closely spaced wide metal lines differ from those used for closely-spaced narrow metal lines, and thus presence of wide metal lines interferes with formation of narrower width lines drawn on the same metal layer. The R-C reduction techniques described herein are compatible with all-narrow-width metal lines on the layer used for transfer lines.

In an embodiment, row decoders 506 are duplicated on each side of the photodiode array, permitting driving each photodiode transfer line 510, 314, 318, 356, 114, 116, 118 from both ends. This can reduce R-C delay from photodiode cells adjacent the row decoders by approximately a factor of 4.

In an embodiment, each transfer line 700 (FIG. 7) of the first (highly loaded) and second (intermediate loaded) groups of transfer lines are forked or tripled. In each transfer line 700, sublines 702, 704, 706 are coupled together at their first end near, and to the same, driver 708 and runs through multiple-photodiode cells, such as multiple-photodiode cells 300, 301, 100. In each cell, a selection transistor such as selection transistors 712-718, 722-728, 732-738 is coupled to one of sublines 702, 704, 706, but not to all three sublines. In the embodiment illustrated, selection transistors 712-718 in several cells couple to subline 702, selection transistors 722-728 in several cells couple to subline 706, and selection transistors 732-738 couple to subline 704. In a particular embodiment of FIG. 7, several cells with a selection transistor coupled to subline may alternate sublines as shown, or in another particular embodiment of FIG. 7 several cells coupled to the same subline may be adjacent to each other, as convenient in layout to reduce contact counts. In embodiments using the sublines of FIG. 7, the capacitive loading of selection transistors is distributed between sublines and, by reducing C, potentially reduces R-C delay up to a factor of the number of sublines, in this embodiment a factor of three. In alternative embodiments, two or four sublines may be provided.

Figure 7:
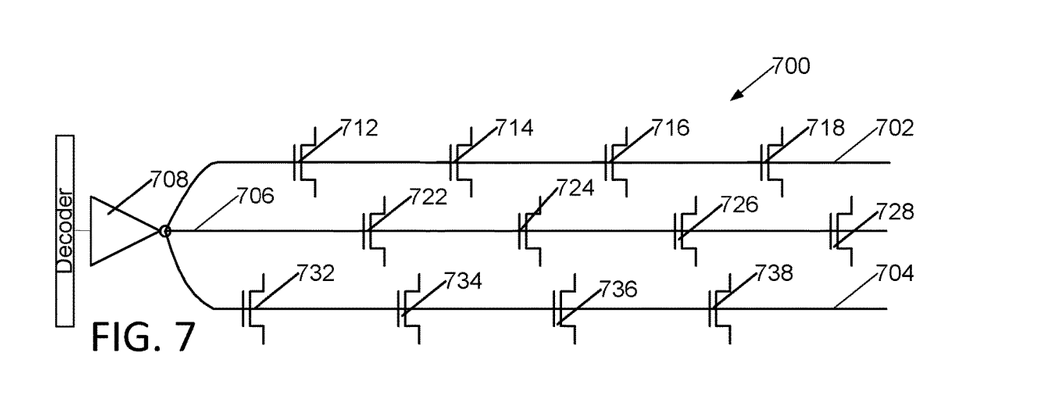
FIG. 7 is a schematic illustration of a forked photodiode transfer line by a driver associated with a decoder.
Figure 8:
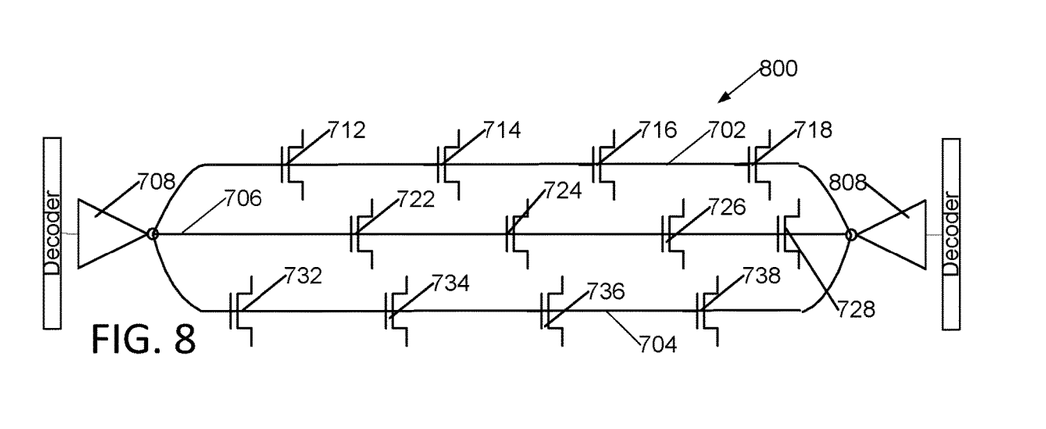
FIG. 8 is a schematic illustration of a forked photodiode transfer line driven at both ends by two drivers each associated with a decoder.

In embodiments according to FIG. 7, sublines are routed as nearly adjacent each other as practical to reduce effect of parasitic capacitance along the adjacent edges of the sublines. In embodiments with three parallel sublines as illustrated, differences in delay along the sublines may arise because edge capacitance of the center subline is effectively shielded by the outer sublines. This delay may be matched either by tying the sublines together at several points across the photodiode array, or by careful simulation and adjusting of selection transistor counts and positions along the sublines.

In some but not all particular embodiments, R-C delay is reduced by both driving transfer lines 800 from both ends as illustrated with reference to FIGS. 6 and 8, and by routing parallel sublines with capacitive load distributed among sublines as described with reference to FIG. 7 and shown in FIG. 8. In these embodiments, each subline is coupled to the other sublines of the same transfer line near its first end and to its associated driver 708 output of a first decoder and coupled to the other sublines of the same transfer line near its second end and to its associated driver 808 output of a second decoder. By combining these techniques, it is possible to reduce skew of switching delay of selection transistors along the transfer lines by 30% to 40% below skew obtained with a single line despite need to switch 12,000 or more selection transistors.

In embodiments having forked transfer lines for highly-loaded transfer lines of group 1 and intermediate-loaded transfer lines of group 2 as discussed with reference to FIG. 7; and also having lightly-loaded phase-detection transfer lines of group-3, the lightly-loaded phase-detection transfer lines need not be forked because there are many fewer selection transistors coupled to the phase-detection lines than are coupled to the transfer lines of groups 1 and 2.

In embodiments, the multiple-photodiode cells may have other numbers of photodiodes than illustrated in FIGS. 1, 3, and discussed herein.

Combinations

The system described herein may be implemented in a variety of ways. Among combinations that inventors anticipate are the combinations below:

An image sensor designated A includes an array of multiple-photodiode cells, each multiple-photodiode cell having multiple photodiodes, each photodiode coupled through a selection transistor to a common node of the multiple-photodiode cell, the selection transistors controlled by respective photodiode transfer lines, a reset transistor coupled to the common node of the multiple-photodiode cell, a sense source follower controlled by the common node of the multiple-photodiode cell, and a read transistor coupled from the sense source follower to a data line. The array has at least one phase detection row comprising phase detection multiple-photodiode cells of the multiple-photodiode cells and normal multiple-photodiode cells of multiple-photodiode cells; and at least one compensation row of dummy multiple photodiode cells of the multiple-photodiode cells. Each of the at least one phase detection row has at least one multiple-photodiode cell with at least one photodiode coupled to the common node of the phase detection multiple-photodiode cell by a selection transistor controlled by a photodiode transfer line separate from photodiode transfer lines coupled to selection transistors of normal multiple-photodiode cells of the phase detection row; and the photodiode transfer lines coupled to the selection transistors of the normal multiple-photodiode cells of the phase detection row are configured with a resistance-capacitance delay reduction of either a first decoder coupled to a first end of the photodiode transfer lines coupled to the selection transistors of the normal multiple-photodiode cells and a second decoder coupled to a second end of the photodiode transfer lines coupled to the selection transistors of the normal multiple-photodiode cells, or forking the photodiode transfer lines coupled to the selection transistors of the normal multiple-photodiode cells.

An image sensor designated AA including the image sensor designated A with the resistance-capacitance delay reduction apparatus including the first decoder coupled to the first end of the photodiode transfer lines coupled to the selection transistors of the normal multiple-photodiode cells and the second decoder coupled to the second end of the photodiode transfer lines coupled to the selection transistors of the normal multiple-photodiode cells.

An image sensor designated AB including the image sensor designated A or AA wherein the resistance-capacitance delay reduction apparatus comprises the photodiode transfer lines coupled to the selection transistors of the normal multiple-photodiode cells being forked.

An image sensor designated AC including the image sensor designated A, AA, or AB wherein the photodiode transfer lines coupled to the selection transistors of the normal multiple-photodiode cells are each forked into three sublines.

An image sensor designated AD including the image sensor designated A where each of the photodiode transfer lines coupled to the selection transistors of the normal multiple-photodiode cells has multiple of sublines, each subline being coupled to other sublines of the same transfer line near its first end and to its associated output of the first decoder.

An image sensor designated AE including the image sensor designated AD where each subline of each of the photodiode transfer lines coupled to the selection transistors of the multiple-photodiode cells is coupled to a single selection transistor of each of multiple normal multiple-photodiode cells.

An image sensor designated AF including the image sensor designated A, AD, or AE where each subline of each of the photodiode transfer lines coupled to the selection transistors of the normal multiple-photodiode cells is coupled to the other sublines of the same transfer line near a second end of the subline and to its associated output of the second decoder.

An image sensor designated AG including the image sensor designated A, AD, AE, or AF where each photodiode transfer line of the phase detection row separate from photodiode transfer lines coupled to selection transistors of normal multiple-photodiode cells of the phase detection row is an unforked photodiode transfer line.

An image sensor designated AH including the image sensor designated A, AD, AE, AF, or AG wherein each of the photodiode transfer lines coupled to the selection transistors of the normal multiple-photodiode cells has three sublines.

A method of reducing resistance-capacitance delay along photodiode transfer lines of an image sensor designated B includes forking a plurality of photodiode transfer lines each into a plurality of sublines coupled together and to a first decoder-driver at a first end of each subline; and distributing selection transistors of a plurality of multiple-photodiode cells among the plurality of sublines.

A method designated BA including the method designated B further including coupling the plurality of sublines of each of the plurality of photodiode transfer lines together and to a second decoder-driver at a second end of each subline.

A method designated BB including the method designated B or BA where there are three sublines of each of the plurality of photodiode transfer lines.

A method designated BC including the method designated B, BA, or BB further comprising providing a phase detection photodiode transfer line for each of multiple phase detection multiple-photodiode cell rows of the plurality of multiple-photodiode cells.

A method designated BD including the method designated BC where the phase detection photodiode-transfer line is unforked.

A method designated BE including the method designated B, BA, BB, BC, or BD where multiple photodiode cells include standard rows comprising standard multiple-photodiode cells without phase-detection multiple-photodiode cells in the same row A method designated BF including the method designated B, BA, BB, BC, BD or BE includes providing multiple compensation rows of the multiple-photodiode cells.

A method designated BG including the method designated B, BA, BB, BC, BD, BE, or BF where each multiple photodiode cell has 2, 3, or 4 photodiodes.

A method designated BH including the method designated BG where each multiple photodiode cell has 3 photodiodes.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall therebetween.

What is claimed is:
1. An image sensor comprising:
   an array comprising a plurality of multiple-photodiode cells, each multiple-photodiode cell comprising:
   a plurality of photodiodes, each photodiode coupled through a selection transistor to a common node of the multiple-photodiode cell, the selection transistors controlled by respective photodiode transfer lines,
a reset transistor coupled to the common node of the multiple-photodiode cell,
a sense source follower controlled by the common node of the multiple-photodiode cell, and
a read transistor coupled from the sense source follower to a data line;
the array comprising at least one phase detection row comprising phase detection multiple-photodiode cells of the plurality of multiple-photodiode cells and normal multiple-photodiode cells of the plurality of multiple-photodiode cells; and
at least one compensation row comprising a plurality of dummy multiple photodiode cells of the plurality of multiple-photodiode cells
wherein each of the at least one phase detection row comprises at least one multiple-photodiode cell comprising at least one photodiode coupled to the common node of the phase detection multiple-photodiode cell by a selection transistor controlled by a photodiode transfer line separate from photodiode transfer lines coupled to selection transistors of normal multiple-photodiode cells of the phase detection row; and
the photodiode transfer lines coupled to the selection transistors of the normal multiple-photodiode cells of the phase detection row configured with a resistance-capacitance delay reduction apparatus selected from the group consisting of a first decoder coupled to a first end of the photodiode transfer lines coupled to the selection transistors of the normal multiple-photodiode cells and a second decoder coupled to a second end of the photodiode transfer lines coupled to the selection transistors of the normal multiple-photodiode cells, and the photodiode transfer lines coupled to the selection transistors of the normal multiple-photodiode cells being forked.

2. The image sensor of claim 1 wherein the resistance-capacitance delay reduction apparatus comprises the first decoder coupled to the first end of the photodiode transfer lines coupled to the selection transistors of the normal multiple-photodiode cells and the second decoder coupled to the second end of the photodiode transfer lines coupled to the selection transistors of the normal multiple-photodiode cells.

3. The image sensor of claim 1 wherein the resistance-capacitance delay reduction apparatus comprises the photodiode transfer lines coupled to the selection transistors of the normal multiple-photodiode cells being forked.

4. The image sensor of claim 3 wherein the photodiode transfer lines coupled to the selection transistors of the normal multiple-photodiode cells are each forked into three sublines.

5. The image sensor of claim 1 wherein each of the photodiode transfer lines coupled to the selection transistors of the normal multiple-photodiode cells comprises a plurality of sublines, each subline being coupled to other sublines of the same transfer line near its first end and to its associated output of the first decoder.

6. The image sensor of claim 5 where each subline of each of the photodiode transfer lines coupled to the selection transistors of the multiple-photodiode cells is coupled to a single selection transistor of each of a plurality of the normal multiple-photodiode cells.

7. The image sensor of claim 6 where each subline of each of the photodiode transfer lines coupled to the selection transistors of the normal multiple-photodiode cells is coupled to the other sublines of the same transfer line near a second end of the subline and to its associated output of the second decoder.

8. The image sensor of claim 7 where each photodiode transfer line of the phase detection row separate from photodiode transfer lines coupled to selection transistors of normal multiple-photodiode cells of the phase detection row is an unforked photodiode transfer line.

9. The image sensor of claim 6 wherein the plurality of sublines of each of the photodiode transfer lines coupled to the selection transistors of the normal multiple-photodiode cells is three sublines.

10. The image sensor of claim 9 where each multiple photodiode cell has 2, 3, or 4 photodiodes.

11. The image sensor of claim 10 where each multiple photodiode cell has 3 photodiodes.

12. A method of reducing resistance-capacitance delay along photodiode transfer lines of an image sensor comprising:
providing an array of multiple-photodiode cells in an array, the multiple-photodiode cells in the array organized in standard rows comprising standard multiple-photodiode cells and phase-detection rows comprising standard multiple-photodiode cells and phase-detection multiple photodiode cells,
providing at least a first decoder-driver that drives a plurality of standard photodiode transfer lines, the standard photodiode transfer lines each being forked into a plurality of standard photodiode transfer sublines near the first decoder-driver; and
distributing a plurality of selection transistors of a plurality of multiple-photodiode cells of the standard rows and a plurality of selection transistors of a plurality of multiple-photodiode cells of the phase-detection rows among the plurality of standard photodiode transfer sublines;
providing a phase detection photodiode transfer line for each of a plurality of the phase-detection rows of the plurality of multiple-photodiode cells, the phase detection photodiode transfer lines coupled to at least one selection transistor of a plurality of phase detection multiple photodiode cells of the plurality of multiple photodiode cells of the phase-detection rows;
where the phase detection photodiode transfer lines are unforked;
the standard rows lack phase-detection multiple-photodiode cells; and
the standard rows comprise standard multiple-photodiode cells without phase-detection multiple-photodiode cells.

13. A method of reducing resistance-capacitance delay along photodiode transfer lines of an image sensor comprising:
forking a plurality of photodiode transfer lines each into a plurality of sublines coupled together and to a first decoder-driver at a first end of each subline;
distributing selection transistors of a plurality of multiple-photodiode cells among the plurality of sublines;
providing a phase detection photodiode transfer line for each of a plurality of phase detection multiple-photodiode cell rows of the plurality of multiple-photodiode cells;
where there are three sublines of each of the plurality of photodiode transfer lines;
where the phase detection photodiode transfer line is unforked;

further comprising providing a plurality of standard rows comprising standard multiple-photodiode cells without phase-detection multiple-photodiode cells; and providing a plurality of compensation rows of the multiple-photodiode cells.

14. The method of claim 13 where each multiple photodiode cell has 2, 3, or 4 photodiodes.

* * * * *